United States Patent
Chen et al.

(10) Patent No.: US 10,141,538 B2
(45) Date of Patent: Nov. 27, 2018

(54) SEALANT, DISPLAY PANEL AND DISPLAY DEVICE

(71) Applicants: BOE TECHNOLOGY GROUP CO., LTD., Beijing (CN); HEFEI BOE OPTOELECTRONICS TECHNOLOGY CO., LTD., Hefei, Anhui (CN)

(72) Inventors: Changdi Chen, Beijing (CN); Tao Yang, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

(*) Notice: Subject to any disclaimer, the term of this patent is extended or adjusted under 35 U.S.C. 154(b) by 0 days.

(21) Appl. No.: 15/504,126

(22) PCT Filed: Jul. 28, 2016

(86) PCT No.: PCT/CN2016/092089
§ 371 (c)(1),
(2) Date: Feb. 15, 2017

(87) PCT Pub. No.: WO2017/063429
PCT Pub. Date: Apr. 20, 2017

(65) Prior Publication Data
US 2017/0279075 A1    Sep. 28, 2017

(30) Foreign Application Priority Data
Oct. 14, 2015 (CN) .......................... 2015 1 0062162

(51) Int. Cl.
*H01L 51/52* (2006.01)
*H01L 27/32* (2006.01)
(Continued)

(52) U.S. Cl.
CPC ........ *H01L 51/5246* (2013.01); *G02F 1/1339* (2013.01); *H01L 27/32* (2013.01);
(Continued)

(58) Field of Classification Search
CPC . H01L 51/5246; H01L 51/5253; H01L 51/56; H01L 27/32; H01L 2251/566; G02F 1/1339
See application file for complete search history.

(56) References Cited

U.S. PATENT DOCUMENTS

2004/0258921 A1* 12/2004 Watanabe ................ C09K 3/10
428/413
2007/0046187 A1*  3/2007 Tsai ..................... H01L 27/322
313/506
(Continued)

FOREIGN PATENT DOCUMENTS

CN         1652366 A     8/2005
CN       101163358 A     4/2008
(Continued)

OTHER PUBLICATIONS

The First Chinese Office Action dated Aug. 1, 2017; Appln. 201510662162.6.
(Continued)

*Primary Examiner* — Donald Raleigh
(74) *Attorney, Agent, or Firm* — Ladas & Parry LLP; Loren K. Thompson

(57) ABSTRACT

A sealant, a display panel and a display device are provided. The sealant includes: a main body material and a reflective material distributed in the main body material. In the case that the display device adopts the sealant, due to the scattering effect of the reflective material, the light incident onto the sealant is scattered by the reflective material and the light scattered by the reflective material cannot be continuously propagated along an original total reflection propagation
(Continued)

direction, so that the light, which is originally totally reflected, emerges from the display panel, and thus the light extraction efficiency of the display panel is improved.

13 Claims, 2 Drawing Sheets

(51) Int. Cl.
  *G02F 1/1339* (2006.01)
  *H01L 51/56* (2006.01)
(52) U.S. Cl.
  CPC ...... *H01L 51/5253* (2013.01); *H01L 51/5271* (2013.01); *H01L 51/56* (2013.01); *H01L 2251/566* (2013.01)

(56) References Cited

U.S. PATENT DOCUMENTS

2008/0219005 A1  9/2008  Fukuda et al.
2011/0134352 A1*  6/2011  Nakagawa ............ G02F 1/1339
                                                                 349/43
2014/0284557 A1*  9/2014  Choi ................... H01L 51/5268
                                                                 257/40

FOREIGN PATENT DOCUMENTS

| CN | 101262006 A | 9/2008 |
| CN | 103050582 A | 4/2013 |
| CN | 104115291 A | 10/2014 |
| CN | 105206652 A | 12/2015 |
| KR | 1020120076940 A | 7/2012 |
| WO | WO 0215292 A2 * | 2/2002 ........... H01L 27/322 |

OTHER PUBLICATIONS

International Search Report and Written Opinion dated Nov. 2, 2016; PCT/CN2016/092089.

The Second Chinese Office Action dated Jan. 17, 2018; Appln. No. 201510662162.6.

* cited by examiner

SEALANT, DISPLAY PANEL AND DISPLAY DEVICE

TECHNICAL FIELD

Embodiments of the present disclosure relate to a sealant, a display panel and a display device.

BACKGROUND

Currently, light extraction efficiency of an Organic Light-Emitting Diode (OILED) display device is relatively low, in part because of a substrate mode/waveguide mode caused by the structure of the OLED. The essence of the substrate mode/waveguide mode is that in the case that light is incident from an optically denser medium onto an optically thinner medium and in the case that an incident angle of the light is greater than a critical angle, the light will be totally reflected and the light cannot emerge from the optically denser medium.

FIG. 1 is a structural schematic view illustrating a display panel. As shown in FIG. 1, in the case that light is incident from a transparent electrode to a glass substrate 02 and the transparent electrode is the optically denser medium compared to the glass substrate 02 and in the case that the incident angle of the light is greater than the critical angle, the light will be totally reflected on a contact surface of the transparent electrode and the glass substrate 02, and thus, the light cannot emerge from the glass substrate 02 but emerges from a sealant 03 for bonding upper and lower substrates of the display panel, so that light extraction efficiency of the display panel is reduced.

SUMMARY

According to embodiments of the disclosure, a sealant is provided. The sealant comprises: a main body material and a reflective material distributed in the main body material.

For example, the reflective material is reflective particles.

For example, a shape of the reflective particles include a sphere shape and a rod shape For example, the reflective particles are formed by a silicon material.

For example, the main body material includes an epoxy acrylic light-curable resin and an epoxy resin.

According to the embodiments of the disclosure, a display panel is provided. The display panel comprises the sealant as described above.

For example, the display panel further comprises: a display region, a dummy region and a sealant region which are arranged from inside to outside. The display region includes a light emission region and a non-light-emission region, and the sealant is arranged in the sealant region.

For example, the display panel further comprises: a reflective column arranged in the dummy region and/or the non-light-emission region.

For example, a plurality of reflection columns are provided in the dummy region, and heights of the plurality of reflection columns are sequentially reduced from outside to inside.

For example, a height difference of two adjacent reflection columns is 8 nm to 12 nm.

For example, each reflection column has a diameter of 10 nm to 12 nm.

For example, an organic light emitting element is arranged in the display region.

For example, a plurality of reflective protrusions are formed on a surface of the reflection column.

According to the embodiments of the disclosure, a display device is provided. The display device comprises the display panel as described above.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

REFERENCE SIGNS ARE

Figure 1:
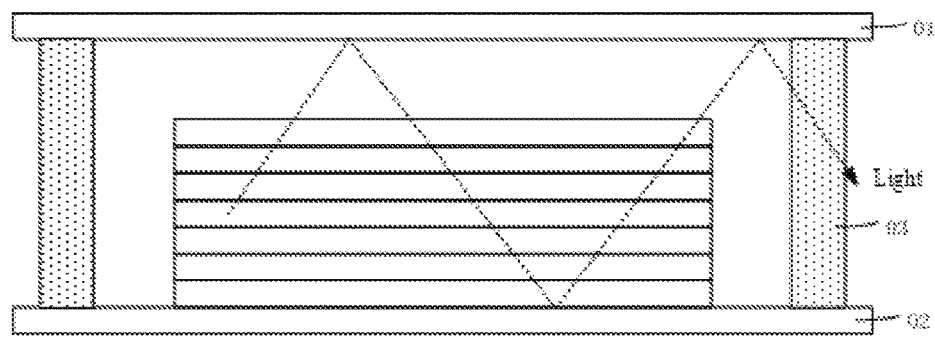
FIG. 1 is a structural schematic view illustrating a display panel.

01—upper substrate; 02—glass substrate; 03—sealant; 10—sealant region; 11—reflective material; 20—dummy region; 21—reflection column; 30—display region; 301—light emission region; 302—non-light-emission region; 31—first substrate; 32—first electrode; 33—hole injection layer; 34—hole transport layer; 35—light—emitting material layer; 36—electron transport layer; 37—electron injection layer; 38—second electrode; 39—second substrate.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. It is obvious that the described embodiments are just a part but not all of the embodiments of the disclosure. Based on the described embodiments of the disclosure herein, those skilled in the art can obtain all other embodiment(s), without any inventive work, which should be within the scope of the disclosure.

Unless otherwise defined, the technical terms or scientific terms here should be of general meaning as understood by those ordinarily skilled in the art. In the patent application description and claims of the present disclosure, words such as "first", "second" and the like do not denote any order, quantity, or importance, but rather are used for distinguishing different components. Words such as "include" or "comprise" and the like denote that elements or objects appearing before the words of "include" or "comprise" cover the elements or the objects enumerated after the words of "include" or "comprise" or equivalents thereof, not exclusive of other elements or objects. Words such as "connect" or "interconnect" and the like are not limited to physical or mechanical connections, but may include electrical connections, whether direct or indirect. Words such as "up", "down", "left", "right" and the like are only used for expressing relative positional relationship, when the absolute position is a described object is changed, the relative positional relationship may also be correspondingly changed.

Embodiment I

The embodiment provides a sealant. The sealant includes: a main body material and a reflective material distributed in the main body material.

For example, the reflective material includes silicon material in a particle shape, and the silicon material includes a pure silicon material or oxide of silicon or nitride of silicon, e.g., silicon dioxide, silicon nitride and the like. The particle-shaped silicon material has an excellent scattering effect; and besides, in the case that the silicon material is used in the sealant, supporting strength of the sealant is improved.

For example, the particle shape includes a sphere shape and/or a rod shape. Herein, both the sphere-shaped and rod-shaped particles are micro particles which have a scattering effect on light and prevent the light from emerging even though the material is transparent.

For example, the main body material includes: an epoxy acrylic light-curable resin and an epoxy resin. For example, the main body material further includes a photoinitiator, a heat curing agent, a coupling agent and an organic powder.

For example, the sealant includes the components in percentage: 60% to 70% of the low-viscosity epoxy acrylic light-curable resin; 1% to 5% of the epoxy resin; 0.5% to 1% of the photoinitiator; 5% to 10% of the heat curing agent; 1% to 2% of the coupling agent; 5% to 10% of the organic powder; and 1% to 5% of the reflective material.

For example, the photoinitiator includes alkylphenones, e.g., α,α-diethoxylacetophenone, α-hydroxybenzophenone or α-aminoalkylphenone; the heat curing agent includes polybasic aliphatic amines, e.g., diaminodiphenyl-methane; the coupling agent includes a silane coupling agent KH550, KH560 or KH570 and the like; the organic powder includes elastic microspheres and the like; and inorganic powder includes silicon dioxide microspheres and the like.

Embodiment II

Figure 2:
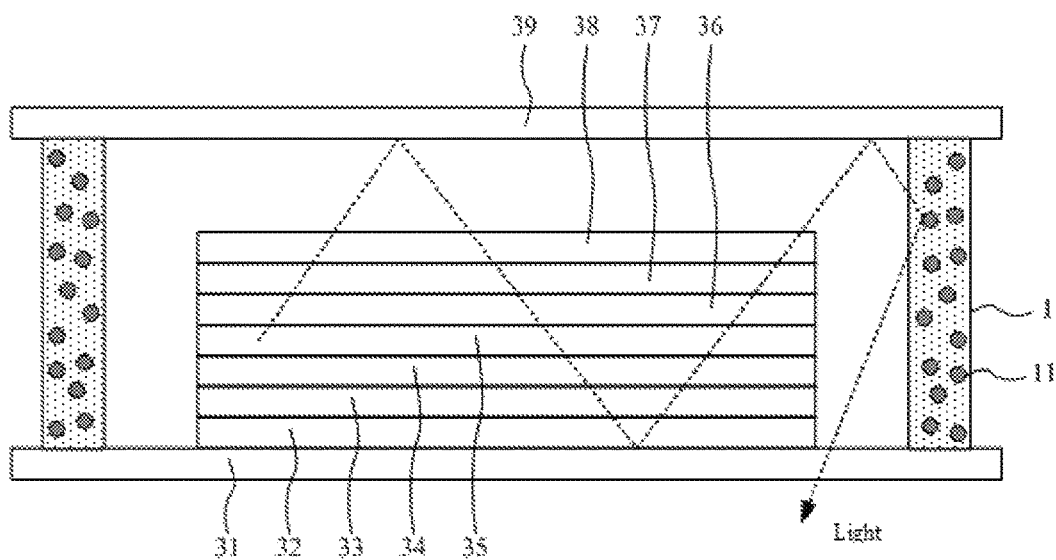
FIG. 2 is a structural schematic view illustrating a display panel provided by embodiments of the present disclosure.

The embodiment provides a display panel. Upper and lower substrates of the display panel are bonded with each other by the sealant in Embodiment I. For example, FIG. 2 is a structural schematic view illustrating the display panel provided by the embodiment of the present disclosure. As shown in FIG. 1, the light within the display panel is totally reflected to be propagated inside the display panel. As shown in FIG. 2, the sealant in Embodiment I is adopted to bond the upper and lower substrates of the display panel; due to existence of the reflective material in the sealant and due to the scattering function of the reflective material, the light incident onto the reflective material of the sealant is scattered and cannot be continuously propagated along an original total reflection direction, and thus part of light, which is originally totally reflected, emerges from the display panel, so that light extraction efficiency of the display panel is improved.

Figure 3:
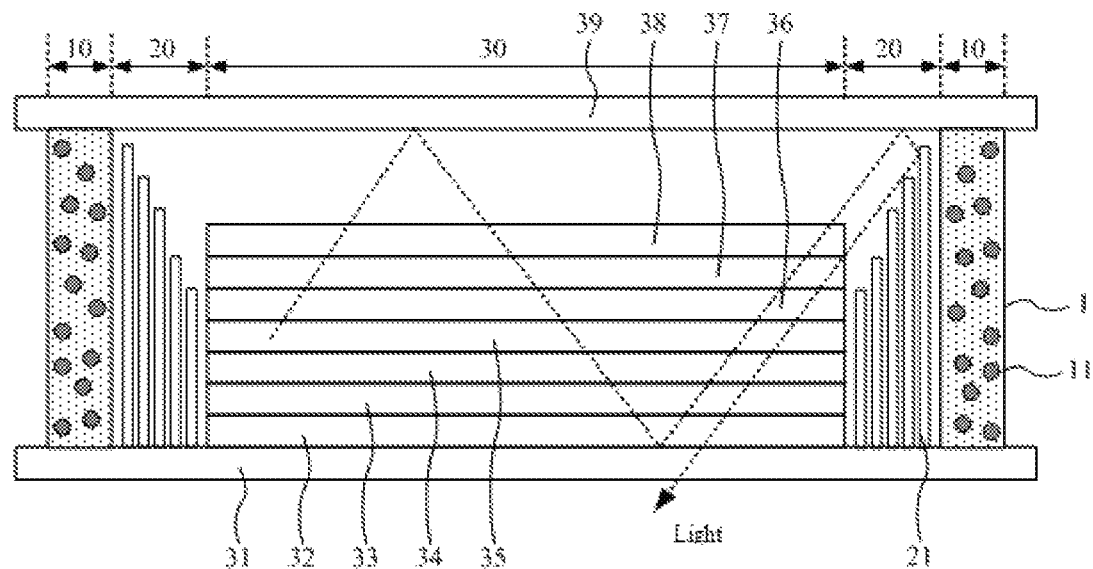
FIG. 3 is a structural schematic view illustrating the display panel provided by the embodiments of the present disclosure.
Figure 4:
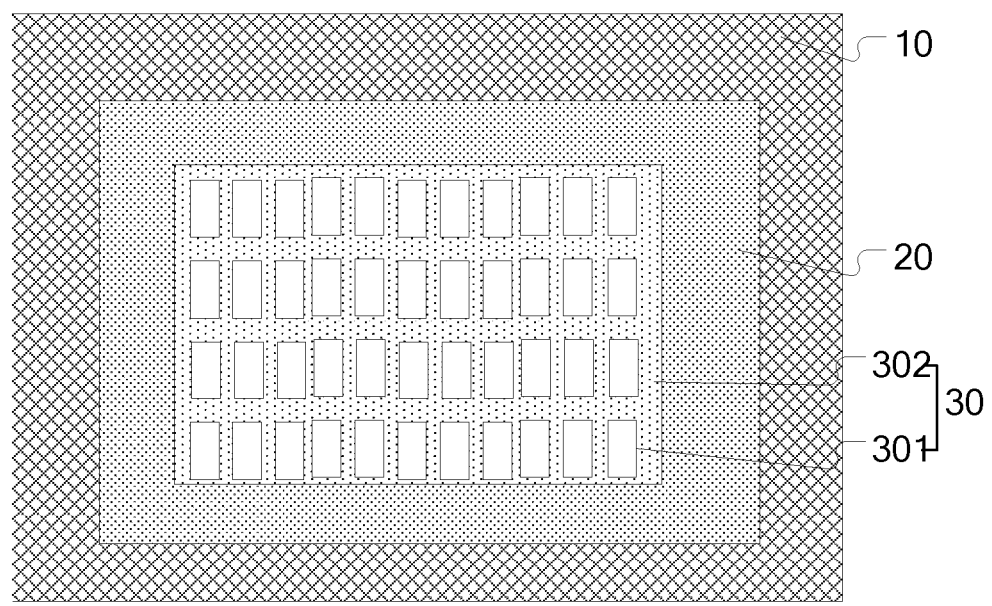
FIG. 4 is a plan structural schematic view illustrating the display panel in FIG. 3.

FIG. 3 is a structural schematic view illustrating another display panel provided by the embodiment of the present disclosure. As shown in FIG. 3, the display panel, from inside to outside, includes a display region 30, a dummy region 20 and a sealant region 10, and the sealant 1 is arranged in the sealant region 10. FIG. 4 is a plan structural schematic view illustrating the display panel in FIG. 3. As shown in FIG. 4, the display region 30 includes a light emission region 301 and a non-light-emission region 302.

For example, as shown in FIG. 3, the display panel further includes a reflection column 21. The reflection column 21 is arranged in the dummy region 20 and/or the non-light-emission region. A material of the reflection column 21 for example is the same with a material of a spacer (PS), so that the reflection column 21 is formed in the process of forming the spacer and a manufacturing process of the display panel is simplified.

It should be noted that in order to guarantee that the sealant 1 has an excellent adhesive property, the quantity of the reflective material 11 distributed in the sealant 1 is limited, and thus, in the case that the light incident to the sealant 1 is not incident to the reflective material 1, the light still possibly emerges from the sealant 1.

According to the embodiment, by providing the reflection column 21 in the dummy region 20 and/or the non-light-emission region, part of light, which is originally totally reflected, is incident onto the reflection column 21 and reflected by the reflection column before being incident onto the sealant 1, so that the conditions that the light is totally reflected are destroyed and the light cannot be totally reflected upon being incident to the upper and lower substrates, and thus, the light extraction efficiency of the display panel is further improved.

For example, in the display panel provided by the embodiment, a plurality of reflection columns 21 are provided, the plurality of reflection columns 21 are arranged in the dummy region 20, and heights of the plurality of reflection columns 21 are sequentially reduced from outside to inside.

For example, the display region 30 of the display panel is arranged on the innermost side, and thus, by arranging the plurality of reflection columns 21 in a form that the heights of the plurality of reflection columns 21 are sequentially reduced from outside to inside, most of light are scattered by the reflective material 11 in the sealant 1 and/or reflected by the reflection columns 21 on the outer side, and thus are returned to the display region 30 and emerge from the display region 30, thereby improving the light extraction efficiency of the display region 30.

For example, a height difference of two adjacent reflection columns is 8 nm to 12 nm.

For example, each reflection column has a diameter of 10 nm to 12 nm.

For example, an organic light emitting element is arranged in the display region 30. For example, the organic light emitting element is arranged in each light emission region 301 of the display region 30. The organic light emitting element for example includes a first substrate 31 and a first electrode 32 arranged on the first substrate 31. A material of the first substrate 31 for example is glass, or a transparent material, e.g., plastic and the like. The first electrode 32 for example is formed of a material with a high work function, e.g., transparent indium tin oxide (ITO), or transparent carbon nano tubes (CNTs) and the like.

For example, in the case that the first electrode is formed by the ITO material, an ITO thin film is deposited on the first substrate 31 by adopting a vacuum magnetron sputtering method.

For example, a hole injection layer 33 is arranged on the first electrode 32, and a material of the hole injection layer 33 includes copper phthalocyanine (CuPc) with an excellent hole injection ability.

For example, a hole transport layer 34 is arranged on the hole injection layer 33, and a material of the hole transport layer 34 includes TCTA (a carbazoles material) with an excellent hole transport ability.

For example, a light-emitting material layer 35 is arranged on the hole transport layer 34, and the light-emitting material layer 35 is deposited by adopting a vacuum thermal evaporation method. For example, the light-emitting material layer 35 adopts a hybrid main light-emitting layer formed by co-doping a green light phosphorescent material Ir(ppy)$_3$ and a red light phosphorescent material Ir(piq)$_2$(acac) with TCTA and TAZ; or the light-emitting material layer 35 adopts a red light-emitting layer formed by doping 4,4'-bis (N-carbazole)-1,1'-biphenyl with 5,6,11,12-tetraphenyl tetracene with a doping ratio of 4,4'-bis (N-carbazole)-1,1'-biphenyl and 5,6,11,12-tetraphenyl tetracene being 97:3, and a green light-emitting layer formed by doping 1,3,5-tris (bromomethyl) benzene with N, N'-dimethylquinacridone with a doping ratio of the 1,3,5-tris (bromomethyl) benzene and N, N'-dimethylquinacridone being 85:15. Meanwhile, an auxiliary light-emitting layer formed by doping a blue light phosphorescent material FCNIr with mCP is adopted, and the blue light-emitting layer is formed by doping tert-butyl-9,10-di (2-naphthalene) anthracene with 2,5,8,11-tetra-t-butylperylene. A doping ratio of tert-butyl-9,10-di (2-naphthalene) anthracene and 2,5,8,11-tetra-t-butylperylene is 95:5. According to the color-mixing mechanism, white light will be generated by color mixing in the case that the three of red, green and blue light-emitting materials are provided in the same light-emitting layer.

For example, an electron transport layer 36 is further arranged on the light-emitting material layer 35, and the electron transport layer 36 is deposited by adopting the vacuum thermal evaporation method. For example, the electron transport layer 36 is formed by quinoline aluminum (Alq$_3$) with an excellent electron transport ability.

For example, an electron injection layer 37 is arranged on the electron transport layer 36, and the electron injection layer 37 is formed by adopting the vacuum thermal evaporation method. For example, the electron injection layer 37 is formed by a material with a low work function, e.g., lithium fluoride (LiF) with an excellent electron injection ability and the like.

For example, a second electrode 38 is arranged on the electron injection layer 37, the second electrode 38 is formed by adopting the vacuum thermal evaporation method, and a material of the second electrode 38 includes Mg, Al or an alloy of Mg and Al. Voltages are applied to the first electrode 32 and the second electrode 38 by an external circuit, electrons are injected by the second electrode 38 (for example, the second electrode 38 is served as a cathode), holes are injected by the first electrode 32 (for example, the first electrode 32 is served as an anode), and the electrons and holes meet in the light-emitting material layer 35 to generate excitons so as to excite the light-emitting materials to emit light.

For example, the reflection column is arranged in the non-light-emission region between the first substrate 31 and the second substrate 39, and the reflection column simultaneously takes an effect of the spacer so as to maintain the gap between the upper and lower substrates. On a side of the second substrate 39, which is close to the second electrode 38, structures (not shown), e.g., a color filter layer and the like, are arranged.

For example, the first electrode 32, the hole injection layer 33, the hole transport layer 34, the light-emitting material layer 35, the electron transport layer 36, the electron injection layer 37 and the second electrode 38 are arranged in the display region 30.

The embodiment as described above mainly shows the case of applying structures, e.g., the sealant 1 and/or the reflection column 21 and the like, to the OLED display panel; however, the embodiment is not limited thereto, and the structures, e.g., the sealant 1 and/or the reflection column 21 and the like, is applicable to other types of display panels as required.

For example, a plurality of reflective protrusions are formed on a surface of the reflection column 21; and more specifically, the plurality of reflective protrusions is formed on any surface of the reflection column 21 which is irradiated by the light, e.g., a lateral surface or a top surface of the reflection column 21. By using the plurality of reflective protrusions, the light incident to the surface of the reflection column 21 is scattered more efficiently so as to change a propagation path of the light incident to the surface of the reflection column 21 to a greater degree and destroy more conditions that the light is totally reflected, thereby improving a quantity of light emerging from the display panel.

Embodiment III

The embodiment provides a display device, including the display panel in Embodiment II. For example, the display device is a display such as a liquid crystal display, an Organic Light-Emitting Diode (OLED) display and the like, and any product or part with a display function, e.g., a television, a digital camera, a mobile phone, a watch, a tablet computer, a notebook computer, a navigator and the like which include the displays.

The display panel provided by the embodiment of the present disclosure has at least the following advantageous effects that: the reflective material is arranged in the sealant, and the sealant is adopted to bond the upper and lower substrates of the display panel; in the case that the normal sealant without the reflective material is adopted, the light is totally reflected between the upper and lower substrates of the display panel to be propagated inside the display panel and cannot emerge from the display panel; in the case that the sealant with the reflective material according to the embodiments of the disclosure is adopted, due to the scattering effect of the reflective material in the sealant on the light, the light incident onto the sealant is scattered by the reflective material and the light scattered by the reflective material cannot be continuously propagated along an original total reflection propagation direction, so that the light, which is originally totally reflected, emerges from the display panel, and thus, the light extraction efficiency of the display panel is improved.

The foregoing embodiments merely are exemplary embodiments of the disclosure, and not intended to define the disclosure. Those skilled in the art can make various changes and variations to the disclosure. Any modifications, equivalent replacements, improvements and the like without departing from the spirit and principle of the disclosure shall fall within the scope of the disclosure.

The foregoing embodiments merely are exemplary embodiments of the disclosure, and not intended to define the scope of the disclosure, and the scope of the disclosure is determined by the appended claim.

The present application claims priority of the Chinese Patent Application No. 201510662162.6 filed on Oct. 14, 2015, the disclosure of which are incorporated herein by its reference in its entirety as part of the present application.

The invention claimed is:

1. A display panel, comprising: a display region, a dummy region and a sealant region which are arranged from inside to outside, wherein
   a plurality of reflection columns are provided in the dummy region, and heights of the plurality of reflection columns are sequentially reduced from outside to inside.

2. A display panel, comprising a display region, a dummy region and a sealant region which are arranged from inside to outside, wherein
   the display region comprises a plurality of light emission regions and a plurality of non-light-emission regions, and the dummy region surrounds the display region so that the dummy region is not provided between two adjacent ones of the plurality of light emission regions; and
   the display panel further comprises: a reflective column arranged in the dummy region.

3. The display panel according to claim 2, further comprising: a sealant, wherein the sealant comprises a main body material and a reflective material distributed in the main body material, and the sealant is arranged in the sealant region.

4. The display panel according to claim 2, wherein a plurality of reflection columns are provided in the dummy region, and heights of the plurality of reflection columns are sequentially reduced from outside to inside.

5. The display panel according to claim 4, wherein a height difference of two adjacent reflection columns is 8 nm to 12 nm.

6. The display panel according to claim 4, wherein each reflection column has a diameter of 10 nm to 12 nm.

7. The display panel according to claim 2, wherein an organic light emitting element is arranged in each of the plurality of light emission regions.

8. The display panel according to claim 2, wherein a plurality of reflective protrusions are formed on a surface of the reflection column.

9. A display device, comprising the display panel according to claim 2.

10. The display panel according to claim 3, wherein the reflective material is reflective particles.

11. The display panel according to claim 10, wherein a shape of the reflective particles include a sphere shape and a rod shape.

12. The display panel according to claim 10, wherein the reflective particles are formed by a silicon material.

13. The display panel according to claim 3, wherein the main body material includes an epoxy acrylic light-curable resin and an epoxy resin.

* * * * *